(12) United States Patent
Lin et al.

(10) Patent No.: US 11,145,621 B2
(45) Date of Patent: Oct. 12, 2021

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Jr-Wei Lin, Kaohsiung (TW); Chia-Cheng Liu, Kaohsiung (TW); Chien-Feng Chan, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 5 days.

(21) Appl. No.: 16/001,809

(22) Filed: Jun. 6, 2018

(65) Prior Publication Data
US 2019/0378817 A1 Dec. 12, 2019

(51) Int. Cl.
*H01L 21/56* (2006.01)
*H01L 25/065* (2006.01)
(Continued)

(52) U.S. Cl.
CPC ........ *H01L 25/0652* (2013.01); *H01L 21/288* (2013.01); *H01L 21/565* (2013.01); *H01L 21/76802* (2013.01); *H01L 21/76877* (2013.01); *H01L 23/315* (2013.01); *H01L 23/3121* (2013.01); *H01L 23/3135* (2013.01);
(Continued)

(58) Field of Classification Search
CPC ............ H01L 25/0652; H01L 23/5386; H01L 21/76877; H01L 23/552; H01L 21/565; H01L 23/315; H01L 23/3135; H01L 21/288; H01L 21/76802; H01L 23/3121; H01L 2924/3025; H01L 2225/06555; H01L 23/295; H01L 2225/06524; H01L 2225/06582; H01L 2224/16225; H01L 2225/06548; H01L 24/16; H01L 2225/06517; H01L 24/73; H01L 24/48; H01L 25/50; H01L 23/5389; H01L 25/105; H01L 25/0657; H01L 24/19; H01L 21/568; H01L 24/97; H01L 25/03; H01L 24/32; H01L 21/561; H01L 24/20
See application file for complete search history.

(56) References Cited

U.S. PATENT DOCUMENTS

2004/0145039 A1* 7/2004 Shim ................ H01L 25/03
257/678
2007/0209834 A1* 9/2007 Kuan .................... H01L 25/105
174/520

(Continued)

FOREIGN PATENT DOCUMENTS

TW 201413911 A 4/2014

*Primary Examiner* — Samuel Park
(74) *Attorney, Agent, or Firm* — Foley & Lardner LLP

(57) ABSTRACT

A semiconductor package device comprises a substrate, a first electronic component, a first encapsulant, a second electronic component, and a first conductive trace. The substrate has a first surface. The first electronic component is on the first surface of the substrate. The first encapsulant is on the first surface of the substrate and covers the first electronic component. The second electronic component is on the first encapsulant. The first conductive trace is within the first encapsulant. The first conductive trace is electrically connected to the second electronic component.

16 Claims, 22 Drawing Sheets

(51) Int. Cl.
  *H01L 23/538* (2006.01)
  *H01L 23/31* (2006.01)
  *H01L 23/552* (2006.01)
  *H01L 21/768* (2006.01)
  *H01L 21/288* (2006.01)
  *H01L 23/00* (2006.01)
  *H01L 23/29* (2006.01)

(52) U.S. Cl.
  CPC ........ H01L 23/5386 (2013.01); H01L 23/552 (2013.01); *H01L 23/295* (2013.01); *H01L 24/16* (2013.01); *H01L 2224/16225* (2013.01); *H01L 2225/06517* (2013.01); *H01L 2225/06524* (2013.01); *H01L 2225/06548* (2013.01); *H01L 2225/06555* (2013.01); *H01L 2225/06582* (2013.01); *H01L 2924/3025* (2013.01)

(56) References Cited

U.S. PATENT DOCUMENTS

| | | | | |
|---|---|---|---|---|
| 2008/0157325 A1* | 7/2008 | Chow | ................ | H01L 23/3128 257/686 |
| 2008/0211084 A1* | 9/2008 | Chow | .................... | H01L 25/03 257/700 |
| 2009/0057862 A1* | 3/2009 | Ha | .......................... | H01L 25/03 257/686 |
| 2009/0166835 A1* | 7/2009 | Yang | ..................... | H01L 25/105 257/686 |
| 2009/0302452 A1* | 12/2009 | Camacho | .......... | H01L 23/49816 257/692 |
| 2010/0140770 A1* | 6/2010 | Pagaila | ................... | H01L 25/03 257/686 |
| 2010/0289128 A1* | 11/2010 | Camacho | ............ | H01L 23/4951 257/670 |
| 2011/0140263 A1* | 6/2011 | Camacho | .......... | H01L 23/49548 257/692 |
| 2012/0292750 A1* | 11/2012 | Chow | .................... | H01L 25/03 257/659 |
| 2013/0221543 A1* | 8/2013 | Choi | ..................... | H01L 21/565 257/777 |
| 2014/0054760 A1* | 2/2014 | Yu | ....................... | H01L 23/3128 257/692 |
| 2014/0084483 A1 | 3/2014 | Chen et al. | | |
| 2014/0210080 A1* | 7/2014 | Chang | .................... | H01L 24/19 257/738 |
| 2015/0294927 A1* | 10/2015 | Yamashita | ........ | H01L 23/49575 257/676 |
| 2017/0062394 A1* | 3/2017 | Lin | ..................... | H01L 23/5385 |
| 2017/0287733 A1* | 10/2017 | Sato | .................. | H01L 27/14618 |

\* cited by examiner

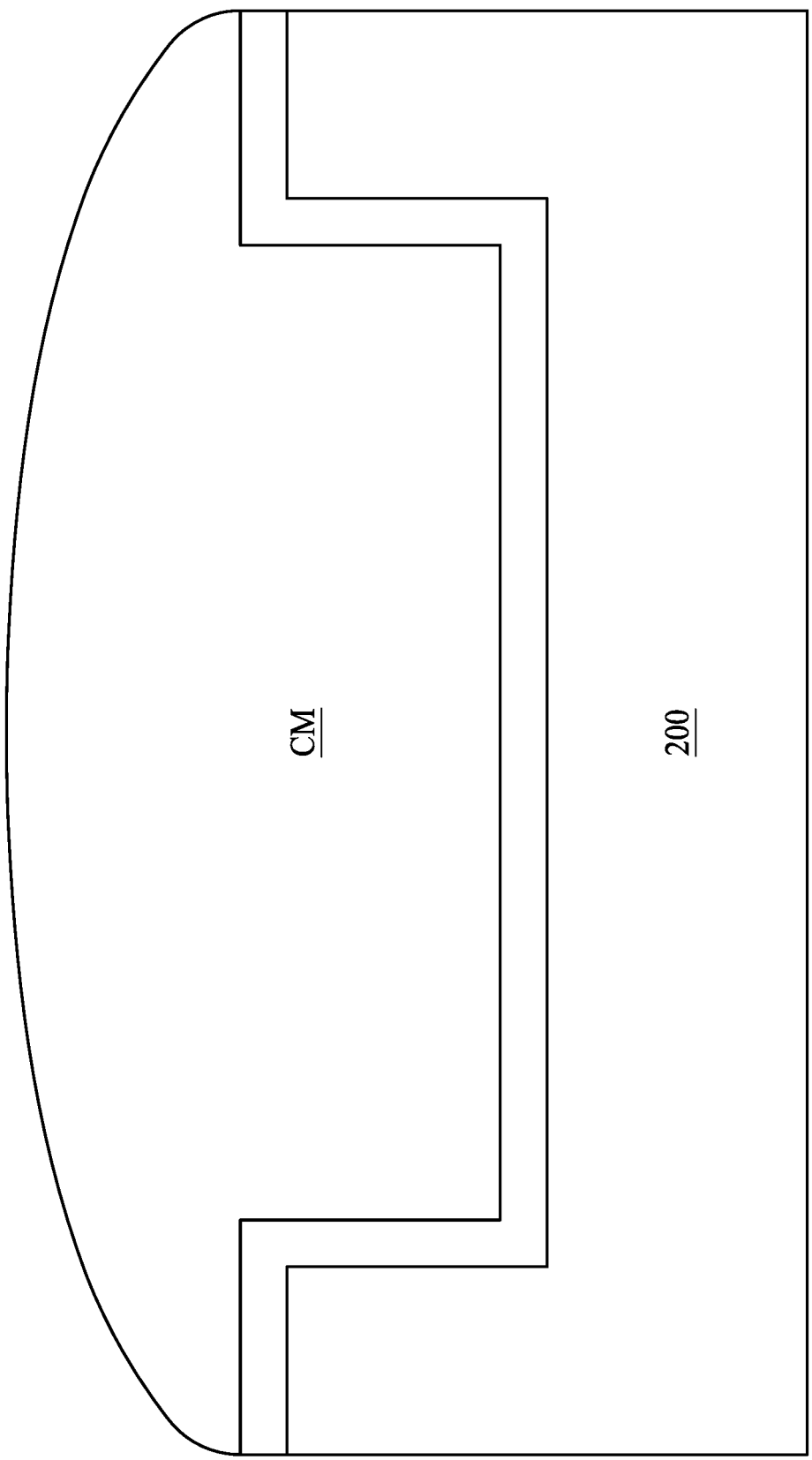

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same. The present disclosure relates to a semiconductor package device including one or more molding compounds and a method of manufacturing the same.

2. Description of the Related Art

With the advancement of electronic technology, electronic products are becoming more compact while offering greater functionality and including greater amounts of integrated circuitry. The distribution density of electronic devices or circuit patterns continues to increase. It is challenging to increase the efficiency of space utilization within a constrained package body.

In current processes, to form a three-dimensional (3D) package device (e.g., package-on-package (POP), printed-circuit-board-assembly (PCBA)), an additional printed circuit board (PCB) is required as an interconnection, which increases the total thickness, the processing complexity and the manufacturing cost of the package device. In addition, the warpage or delamination may occur due to increased layers.

SUMMARY

In one aspect, according to some embodiments, a semiconductor package device comprises a substrate, a first electronic component, a first encapsulant, a second electronic component, and a first conductive trace. The substrate has a first surface. The first electronic component is on the first surface of the substrate. The first encapsulant is on the first surface of the substrate and covers the first electronic component. The second electronic component is on the first encapsulant. The first conductive trace is within the first encapsulant. The first conductive trace is electrically connected to the second electronic component.

In another aspect, according to some embodiments, a method of manufacturing a semiconductor package device comprises (a) providing a substrate; (b) disposing a first electronic component on the substrate; (c) forming a first molding compound on the substrate to cover the first electronic component, the first molding compound having a first surface; (d) forming a trench on the first surface of the first molding compound into the first molding compound; and (e) filling the trench with a conductive material.

BRIEF DESCRIPTION OF THE DRAWINGS

Aspects of the present disclosure are best understood from the following detailed description when read with the accompanying drawings. It is noted that various features may not be drawn to scale, and in the drawings the dimensions of the depicted features may be arbitrarily increased or reduced for clarity of discussion.

FIG. 4A, FIG. 4B, FIG. 4C and FIG. 4D illustrate a method of manufacturing a semiconductor package device in accordance with some embodiments of the present disclosure.

Common reference numerals are used throughout the drawings and the detailed description to indicate the same or similar elements. The present disclosure will be more readily understood from the following detailed description taken in conjunction with the accompanying drawings.

DETAILED DESCRIPTION

The present disclosure provides a semiconductor package device and a method of manufacturing the semiconductor package device. In some embodiments, conductive traces are embedded in the molding compound and serve as interconnections, which may allow omission of an additional PCB, thus reducing the total thickness, the warpage or delamination risk, and the cost. In some embodiments, trenches formed by a laser process on the molding compound are filled by conductive material with a vacuum process, which can make the resulting conductive traces more compact and uniform.

Figure 1A:
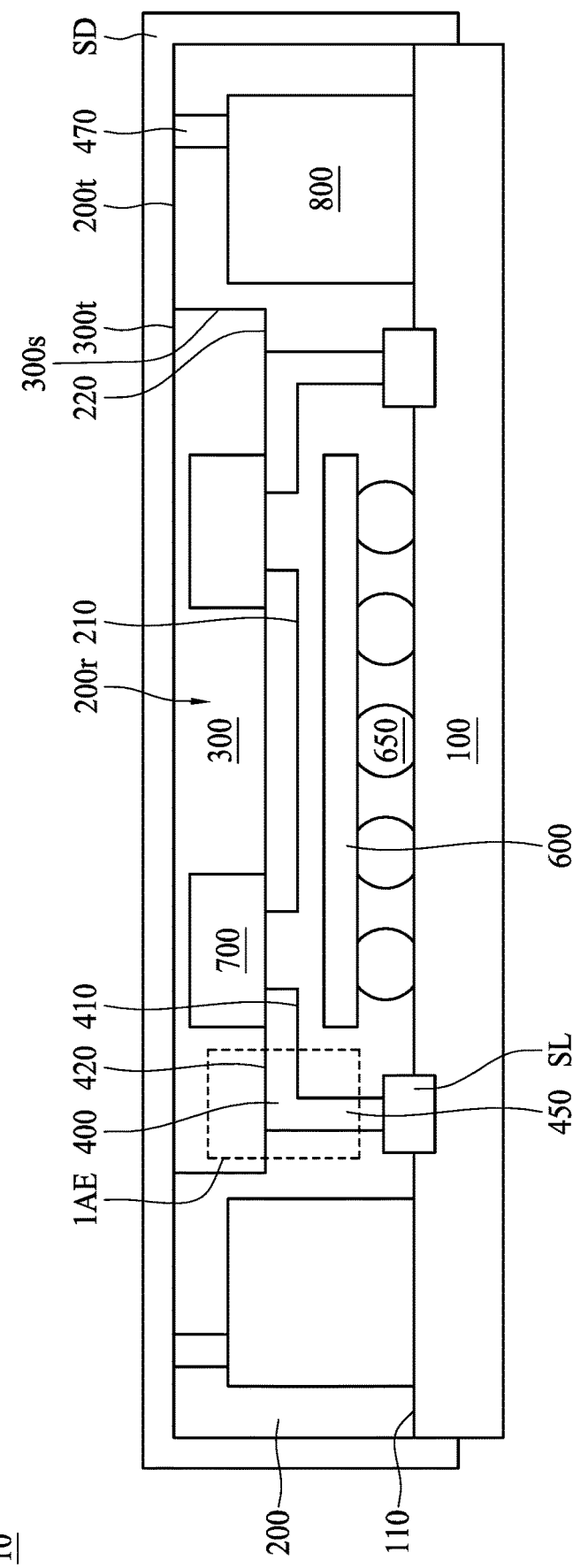
FIG. 1A illustrates a cross-sectional view of a semiconductor package device in accordance with some embodiments of the present disclosure.

FIG. 1A illustrates a cross-sectional view of a semiconductor package device 10 in accordance with some embodiments of the present disclosure. The semiconductor package device 10 includes a substrate 100, an electronic component 600, an encapsulant 200, an electronic component 700, and a conductive trace 400.

As shown in FIG. 1A, the substrate 100 has a surface 110. The substrate 100 may be, for example, a printed circuit board, such as a paper-based copper foil laminate, a composite copper foil laminate, or a polymer-impregnated glass-fiber-based copper foil laminate. The substrate 100 may include an interconnection structure, such as a redistribution layer (RDL) or a grounding element. In some embodiments, the grounding element is a via exposed from a lateral surface of the substrate 100. In some embodiments, the grounding element is a metal layer exposed from the lateral surface of the substrate 100. In some embodiments, the grounding element is a metal trace exposed from the lateral surface of the substrate 100.

The electronic component 600 is disposed on the surface 110 of the substrate 100. The electronic component 600 may be a chip or a die including a semiconductor substrate, one or more integrated circuit devices, and one or more overlying interconnection structures therein. The integrated circuit devices may include active devices such as transistors and/or passive devices such as resistors, capacitors, inductors, or a combination thereof. As shown in FIG. 1A, the electronic component 600 may be mounted on or connected to the substrate 100 by a plurality of conductors 650. In some embodiments, the conductors 650 include solder balls.

The encapsulant 200 is disposed on the surface 110 and covers the electronic component 600. In some embodiments, the electronic component 600 is embedded within the encapsulant 200. The encapsulant 200 may define a recess 200r recessed from a surface 200t of the encapsulant 200. In some embodiments, the encapsulant 200 includes an epoxy resin having fillers, a molding compound (e.g., an epoxy molding compound or other molding compounds), a polyimide, a phenolic compound or material, a material with a silicone dispersed therein, or a combination thereof.

Figure 1B:
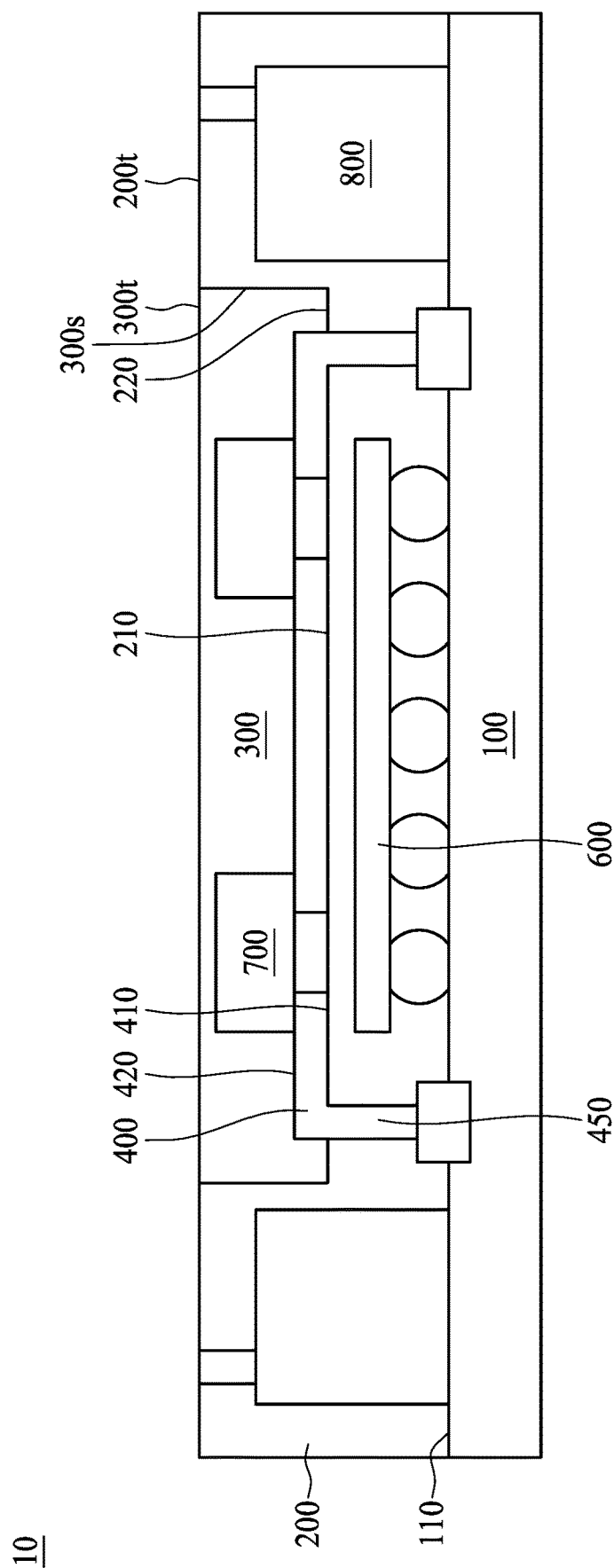
FIG. 1B illustrates a cross-sectional view of a package element in accordance with some embodiments of the present disclosure.

The electronic component 700 is disposed over or on the encapsulant 200. For example, the electronic component 700 may be disposed within the recess 200r of the encapsulant 200. The electronic component 700 may be laterally surrounded by the encapsulant 200. In the embodiment shown in FIG. 1A, the electronic component 700 is in contact with a surface 220 of the encapsulant 200. In some embodiments, as shown in FIG. 1B, the electronic component 700 is spaced apart from the surface 220 of the encapsulant 200. For example, a space or a gap can be defined between the electronic component 700 and the encapsulant 200. In some embodiments, the electronic component 700 has the same or similar property as that of the electronic component 600.

As shown in FIG. 1A, the conductive trace 400 is within the encapsulant 200 and is electrically connected to the electronic component 700. The conductive trace 400 may be substantially parallel to the surface 110 of the substrate 100. In some embodiments, the conductive trace 400 is at least partially embedded in the encapsulant 200. In some embodiments, at least two surfaces of the conductive trace 400 are in contact with the encapsulant 200. For example, a surface 410 (e.g., a bottom surface) and a lateral surface of the conductive trace 400 are covered by the encapsulant 200 while a surface 420 (e.g., a top surface) of the conductive trace 400 is exposed from the encapsulant. For example, the surface 420 of the conductive trace 400 is substantially coplanar with the surface 220 of the encapsulant 200. The conductive trace 400 may be embedded under the recess 200r and at least partially overlapped with the recess 200r from a top view perspective. In some embodiments, the conductive trace 400 is formed of or includes, a conductive material such as a metal or metal alloy. Examples include gold (Au), silver (Ag), aluminum (Al), copper (Cu), or an alloy thereof.

In some embodiments, a roughness of the surface 410 of the conductive trace 400 is greater than a roughness of the surface 420 of the conductive trace 400. In some embodiments, a roughness of the surface 210 of the encapsulant 200 is greater than a roughness of the surface 220 of the encapsulant 200. In some embodiments, the roughness difference between the surface 210 and the surface 220 or the roughness difference between the surface 410 and the surface 420 may be a result of a laser or etching process exerted on the surface 210. For example, during formation of the conductive trace 400, a laser or etching process may be used to form a trench pattern in the encapsulant 200, which exposes the surface 210. A conductive material is then used to fill the trench pattern by vacuum printing process, one or more times. A drilling or cavity routing process may then be used to form the recess 200r and the conductive trace 400, which exposes the surface 220. Therefore, a roughness of the surface 210 or 410 is greater than a roughness of the surface 220 or 420. In some embodiments, the conductive material used to form the conductive trace 400 may have a thixotropic index greater than about 4.5 and/or a viscosity greater than about 105000 cpa·s, which may facilitate the solidification of the conductive trace 400 and make the conductive trace 400 more compact. In some embodiments, the recess 200r formed by a cavity routing process can be used to accommodate one or more electronic components.

In some embodiments, as shown in FIG. 1B, the conductive trace 400 is disposed over or on the encapsulant 200. The surface 220 of the recess 200r may be substantially coplanar with the surface 410 of the conductive trace 400. In this case, the surface 210 of the encapsulant 200, which is in contact with the surface 410 of the conductive trace 400, may have the same or similar roughness as that of the surface 220 of the encapsulant 200. The conductive trace 400 in FIG. 1B may be disposed by a dispensing process with material having a thixotropic index less than about 2.5, and/or has a viscosity less than about 4500 cpa·s.

As shown in FIG. 1A, in some embodiments, the semiconductor package device 10 may include another encapsulant 300. The encapsulant 300 is disposed in a recess 200r recessed from a surface 200t of the encapsulant 200. The encapsulant 300 may be embedded within the encapsulant 200 and covers the electronic component 700. In some embodiments, the encapsulant 300 includes the same or similar material as that of the encapsulant 200. In some embodiments, the encapsulant 300 includes different material from that of the encapsulant 200. In some embodiments, a surface 300t of the encapsulant 300 is substantially coplanar with the surface 200t of the encapsulant 200.

As shown in FIG. 1A, the semiconductor package device 10 may include another conductive trace 450. The conductive trace 450 is at least partially within the encapsulant 200 and electrically connected to the conductive trace 400. The conductive trace 450 may be substantially perpendicular to the surface 110 of the substrate 100.

Figure 1C:
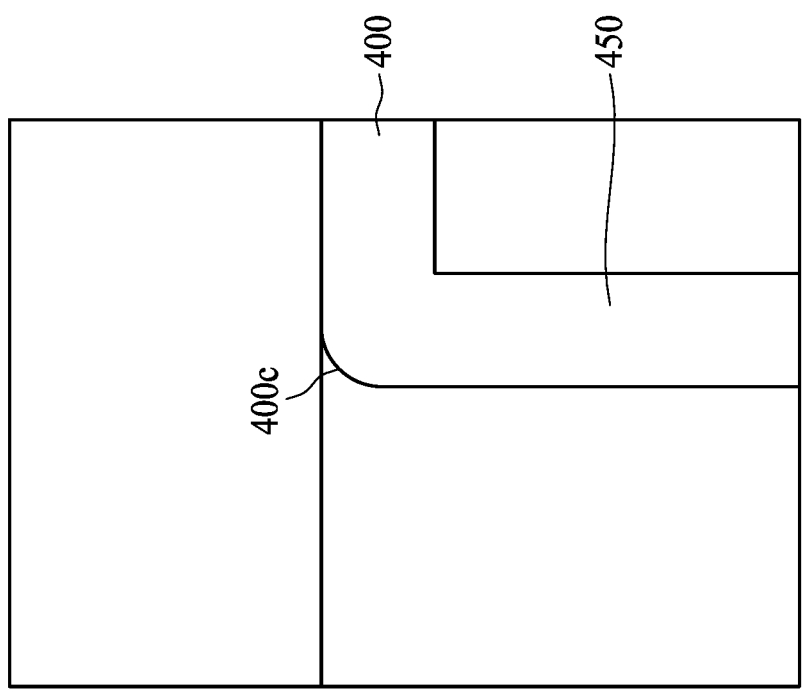
FIG. 1C illustrates an enlarged view of a portion of the semiconductor package device in FIG. 1A.

FIG. 1C illustrates an enlarged view of a portion 1AE of the semiconductor package device 10 in FIG. 1A. As shown in FIG. 1C, a junction between the conductive trace 400 and the conductive trace 450 has a round or curve portion 400c. The curve portion 400c may be a result of the vacuum printing process, one or more times, during forming the conductive trace 400 or the conductive trace 450. For example, forming the conductive trace 400 or the conductive trace 450 may include forming a trench or a via in the encapsulant 200 and filling the trench or via with conductive material one or more times by the vacuum printing process, which may increase the density or uniformity of the conductive trace 400 or the conductive trace 450.

In the embodiment shown in FIG. 1A, the semiconductor package device 10 may include a stop layer SL on the surface 110 of the substrate 100. The stop layer SL is in contact with the second conductive trace. The stop layer SL may include metal and may serve as a stop layer in a process for forming the conductive trace 450, such as a drilling or etching process. For example, the stop layer SL can be used to prevent the surface 110 of the substrate 100 being damaged or etched during the drilling or etching process. The stop layer SL may have a recess portion corresponding to the conductive trace 450 on a top surface of the stop layer SL. The recess portion may be a result of the drilling or etching process.

In the embodiment shown in FIG. 1A, the semiconductor package device 10 includes a shielding layer SD. The shielding layer SD covers the encapsulant 200 and the encapsulant 300. In some embodiments, the shielding layer SD covers at least a portion of sidewalls of the substrate 100 and may be electrically connected to the substrate 100. Alternatively, the shielding layer SD may fully cover the sidewalls of the substrate 100. The shielding layer SD may include conductive material and may be disposed by a sputtering process. The shielding layer SD can be used to provide an electromagnetic interference (EMI) protection for the electronic components 600 and 700.

As shown in FIG. 1A, the semiconductor package device 10 may include another electronic component 800. The electronic component 800 is disposed on the surface 110 of the substrate 100 and is covered by the encapsulant 200. In some embodiments, a thickness of the electronic component 800 is greater than a thickness of the electronic component 600. In some embodiments, the electronic component 800 has a thickness greater than a sum of the thickness of the electronic component 600 and a thickness of the electronic component 700. In FIG. 1A, the semiconductor package device 10 also includes another conductive trace 470. The conductive trace 470 is disposed to penetrate the encapsulant 200 and be electrically connected to the electronic component 800. In some embodiments, the conductive trace 470 may be electrically connected to the shielding layer SD or an external device.

In some embodiments, during manufacturing the semiconductor package device 10, a depth or height of a trench (or trench pattern) used to form the conductive trace 400, or a depth or height of the recess 200r is designed to provide a space for the vacuum printing process, which may involve multiple times or cycles of screening the conductive material and applying vacuum printing (details will be explained later), thus the conductive trace 400 can be made more compact.

In some embodiments of the present disclosure, conductive traces (such as the conductive trace 400 or 450) are embedded in a molding compound (such as the encapsulant 200) and serve as interconnections between different components (such as the electronic component 700, the electronic component 600, the substrate 100, or the electronic component 800). This design may allow omission of an additional PCB, thus reducing the total thickness, the warpage or delamination risk, and the cost. This design may also improve the space utilization efficiency for arranging different components (for example, the electronic components 600, 700 and 800) within the semiconductor package device 10.

FIG. 2A, FIG. 2B, FIG. 2C, FIG. 2D, FIG. 2E, FIG. 2F, FIG. 2G, FIG. 2H and FIG. 2I are cross-sectional views of a semiconductor package device 20 at various stages of fabrication, in accordance with some embodiments of a method of manufacturing a semiconductor package device of the present disclosure. Various figures have been simplified to more clearly present aspects of the present disclosure. In some embodiments, the semiconductor package device 20 has the same or similar properties as those of the semiconductor package device 10 in FIG. 1A.

Figure 2A:
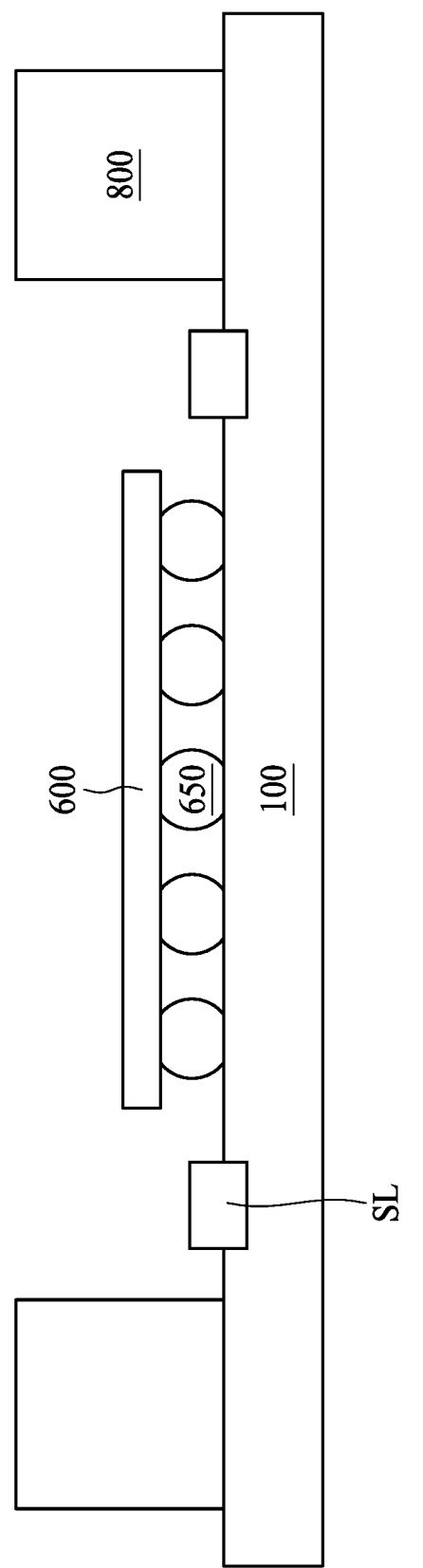
FIG. 2A, FIG. 2B, FIG. 2C, FIG. 2D, FIG. 2E, FIG. 2F, FIG. 2G, FIG. 2H and FIG. 2I illustrate a method of manufacturing a semiconductor package device in accordance with some embodiments of the present disclosure.

Referring to FIG. 2A, a substrate 100 is provided. An electronic component 600 is disposed on the substrate 100 through solder balls 650 by, for example, a surface mount technology (SMT) process. In some embodiments, the electronic component 600 may be mounted on the substrate 100 by a die attach film (DAF) or flip-chip bonding. Another electronic component 800 is also disposed on the substrate 100. A stop layer SL is disposed on the substrate 100 by, for example, a plating process.

Figure 2B:
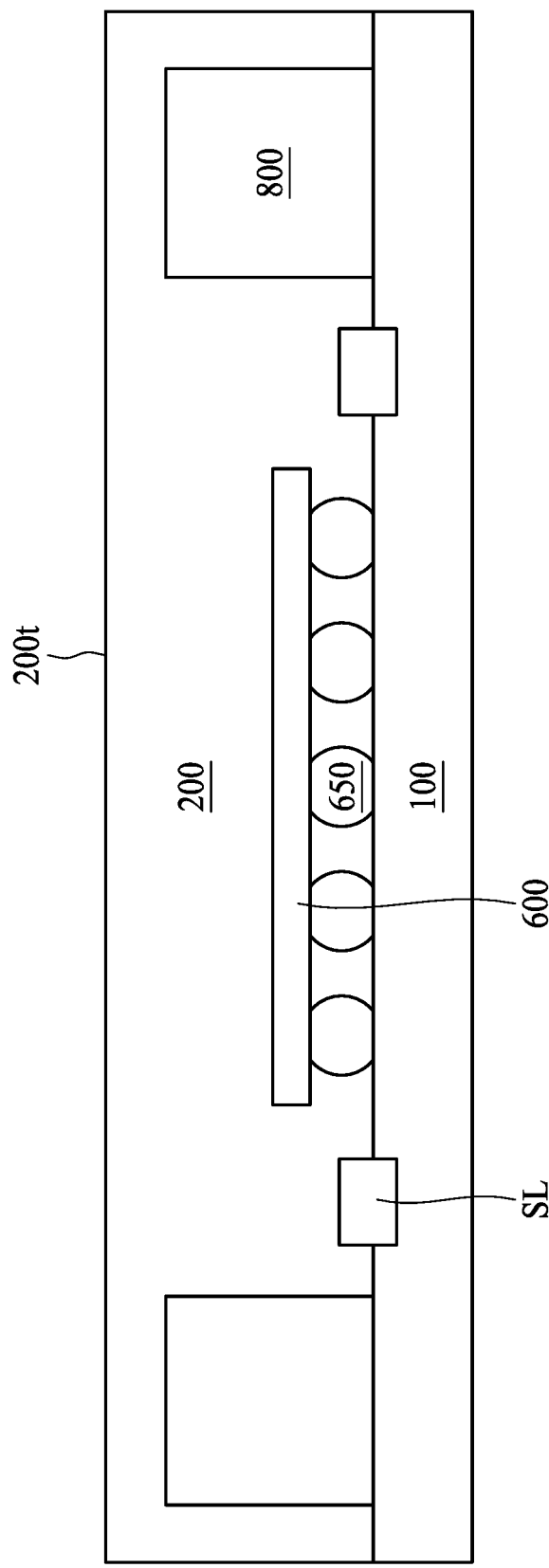

Referring to FIG. 2B, a molding compound 200 is formed on the substrate 100 to cover the electronic component 600 and the electronic component 800 by, for example, a transferring molding or a compression molding process. The molding compound 200 has a surface 200t (or a top surface 200t).

Figure 2C:
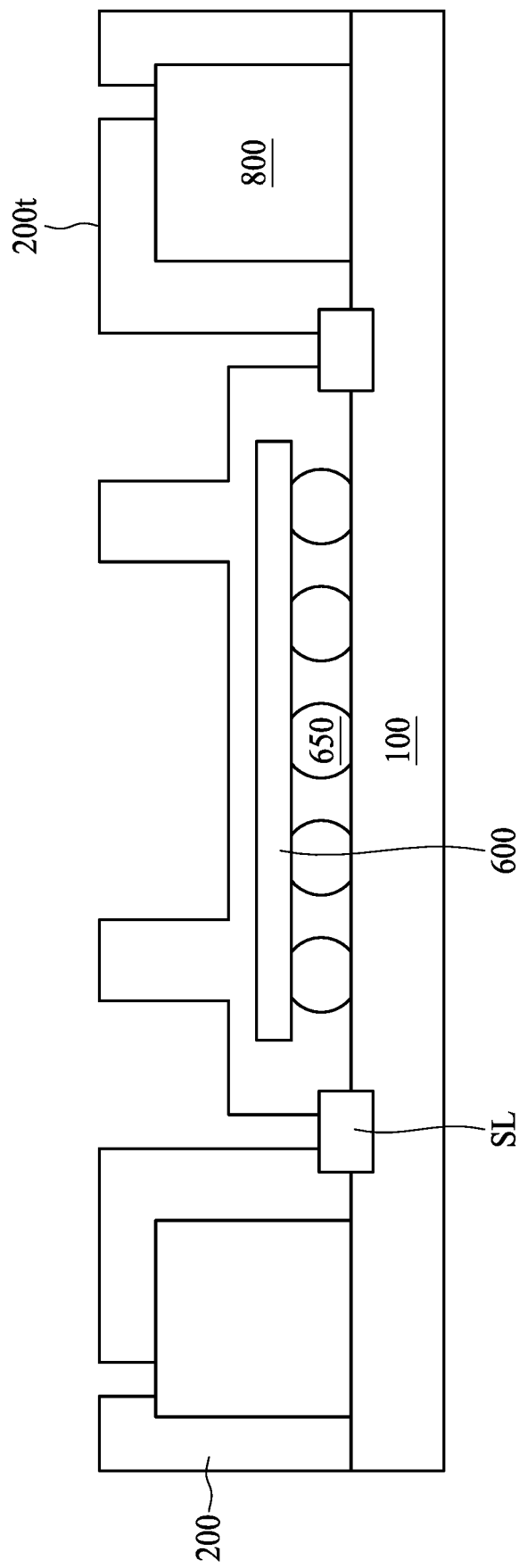

Referring to FIG. 2C, a trench or a trench pattern (which may include a cavity, a via or a through hole) is formed on the surface 200t of the molding compound 200 and into the molding compound 200. In some embodiments, a portion of the stop layer SL and a portion of the electronic component 800 are exposed from the molding compound 200. The operation of forming the trench (or trench pattern) may include a drilling process or a laser cutting process.

Figure 2D:
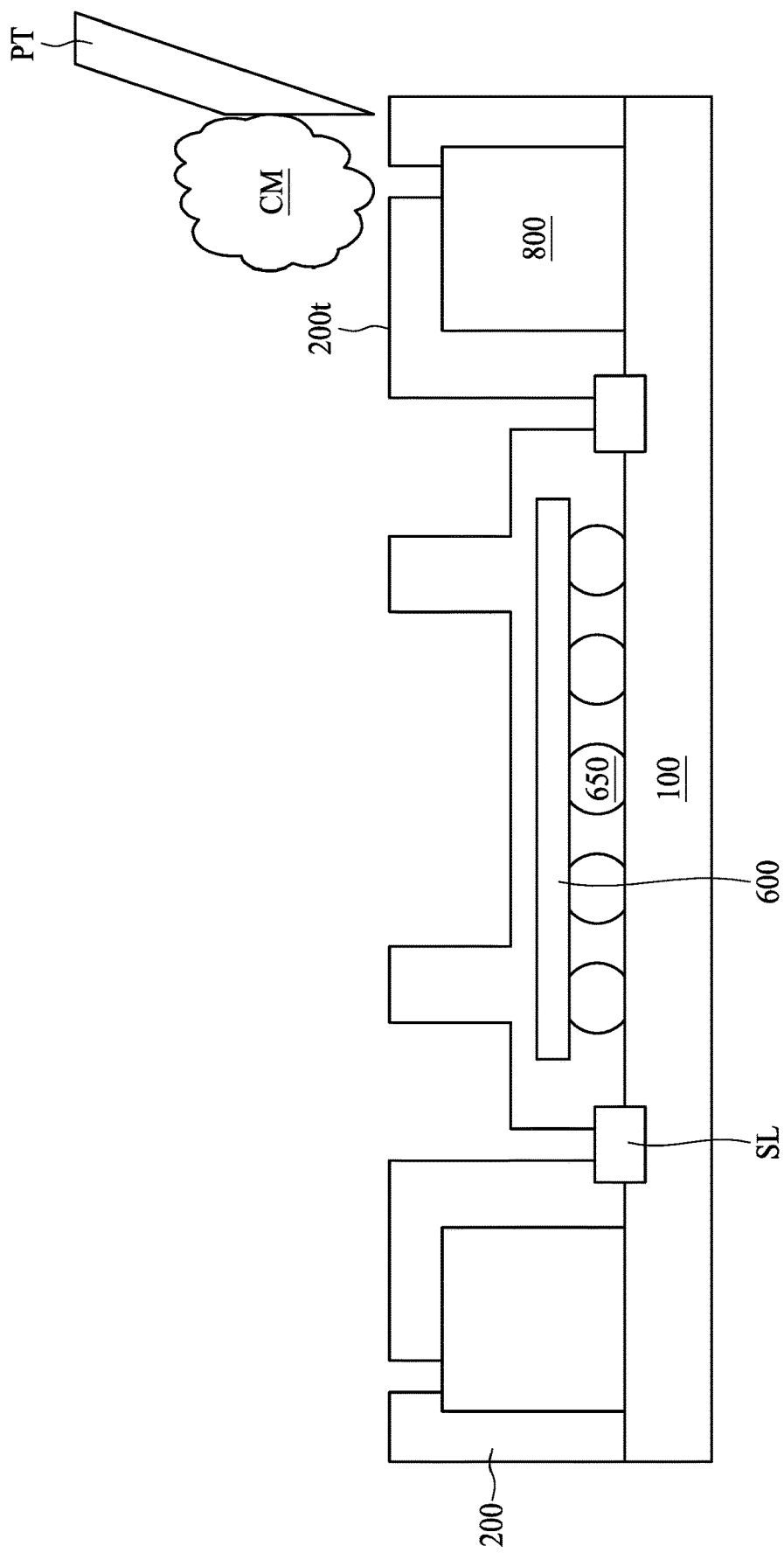
Figure 2E:
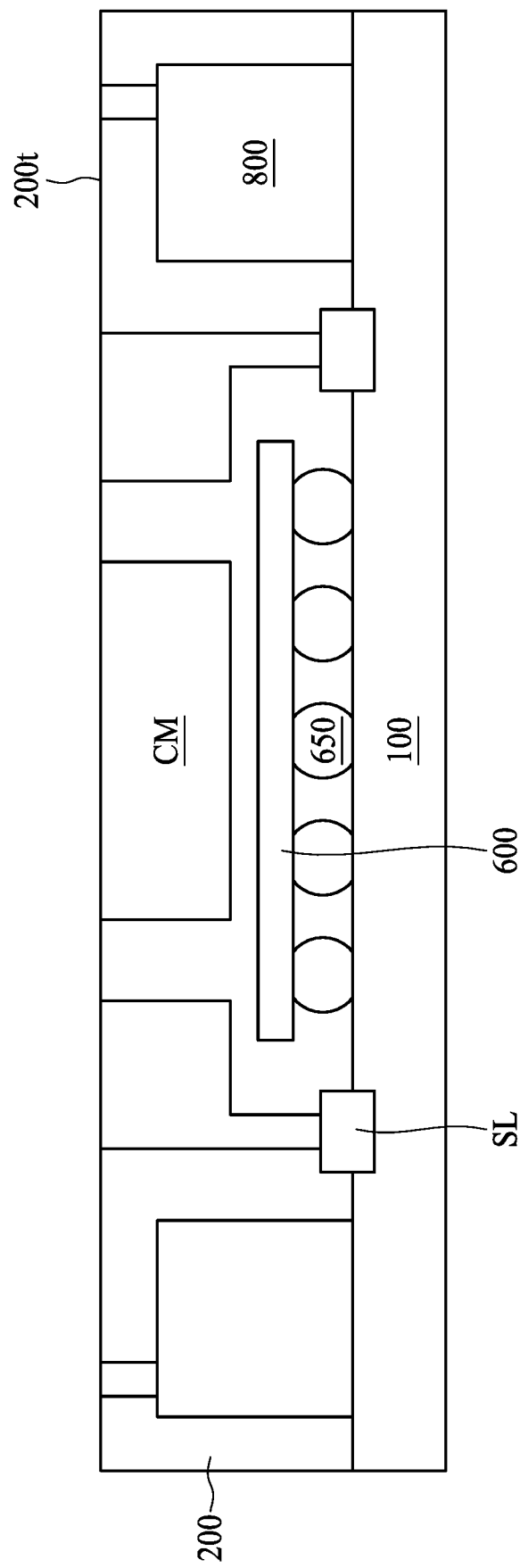

Referring to FIG. 2D and FIG. 2E, the trench is filled with a conductive material CM. In some embodiments, the operation of filling the trench includes a vacuum printing process. In some embodiments, the operation of filling the trench includes a dispensing process. As shown in FIG. 2D, the filling operation may include a smearing, a printing, a spreading, a screen printing, or a brushing process of the conductive material CM by a printing tool PT.

Figure 2F:
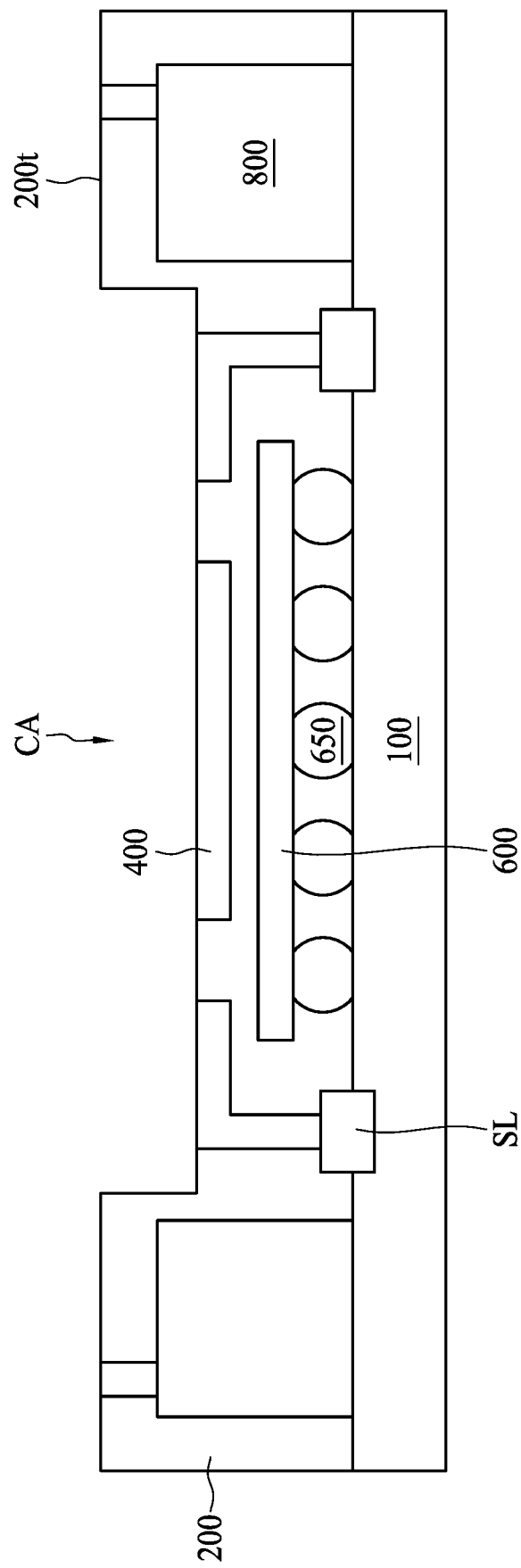

Referring to FIG. 2F, a portion of the conductive material CM and a portion of the molding compound 200 are removed to form a cavity CA. The operation of forming the cavity CA may include a drilling, a cavity routing or an etching process. The remaining conductive material may define a conductive trace 400.

Figure 2G:
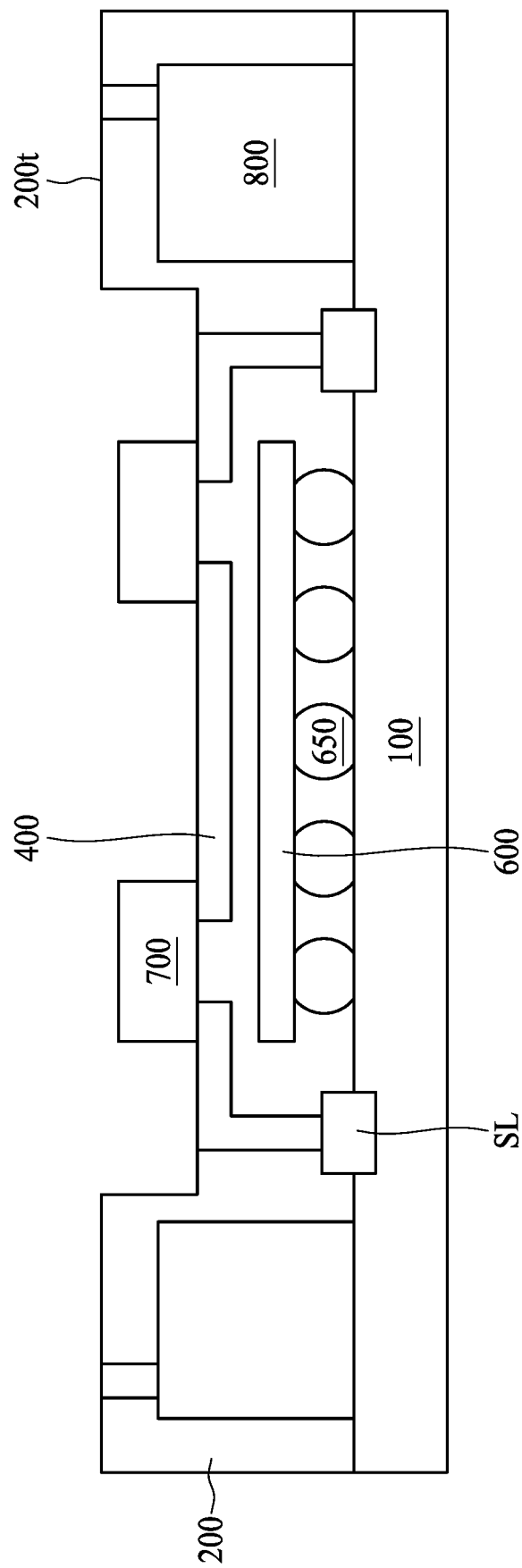

Referring to FIG. 2G, another electronic component 700 is disposed within the cavity CA and on the conductive material CM (or the conductive trace 400). The electronic component 700 may be disposed by an SMT process. The electronic component 700 may be electrically connected to the substrate 100, the electronic component 600, or the electronic component 800 through the conductive trace 400.

Figure 2H:
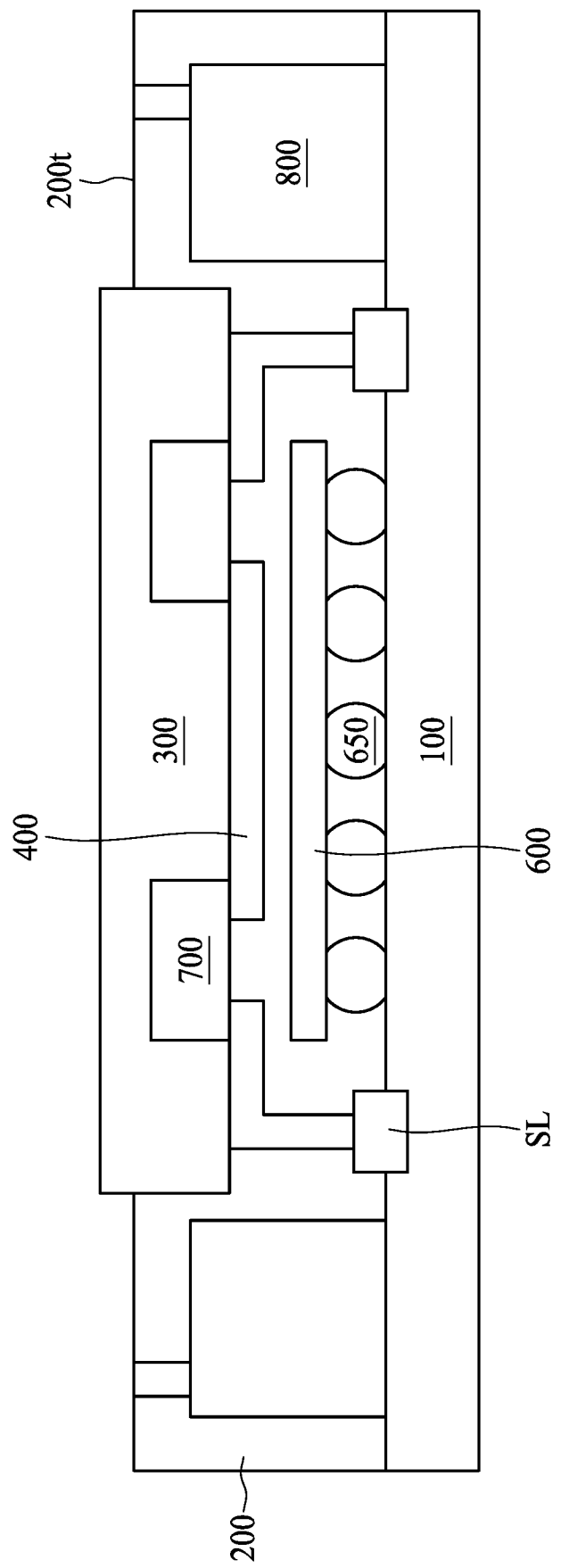
Figure 2I:
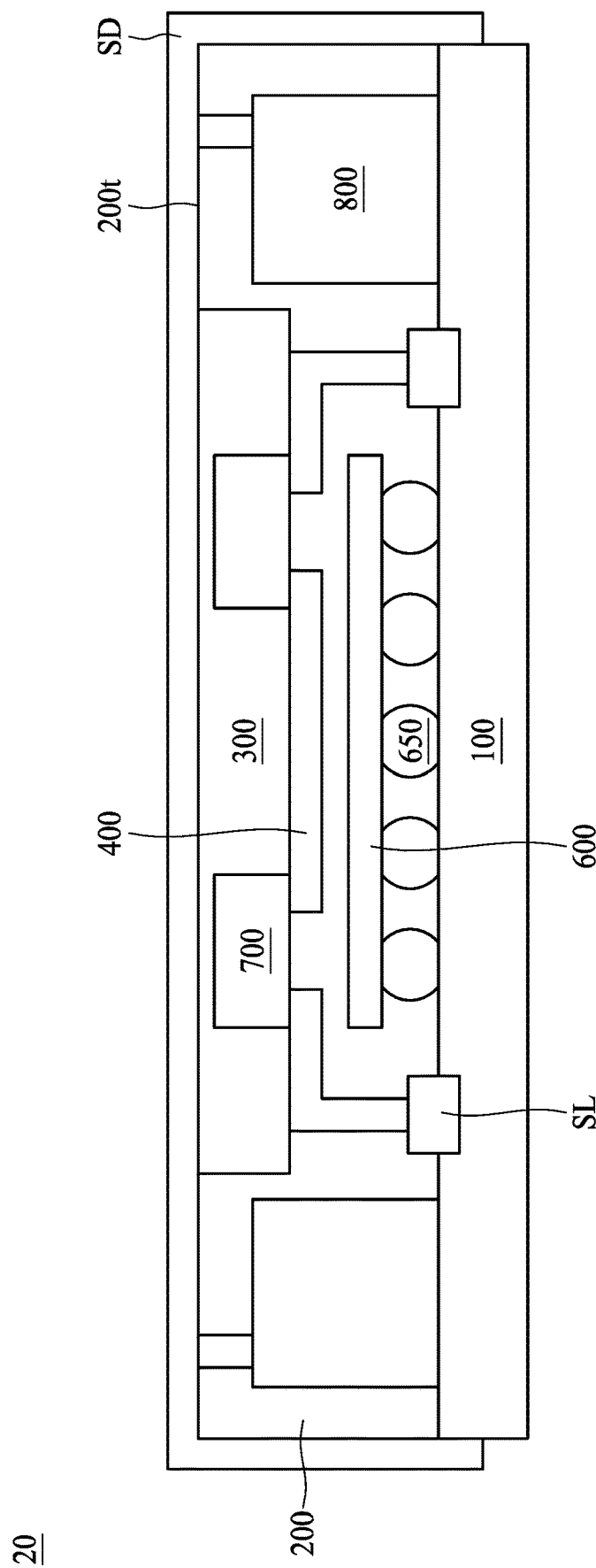

Referring to FIG. 2H, another molding compound 300 is formed within the cavity CA to fill the cavity CA and cover the electronic component 700. The molding compound 300 may be formed with a dispensing process. Referring to FIG. 2I, a top grinding process is used to remove a portion of the molding compound 300 such that a top surface of the molding compound 300 is coplanar with a top surface of the molding compound 200. A shielding layer SD is then disposed to cover the molding compound 200, the molding compound 300 and at least a portion of the substrate 100 by, for example, a sputter process.

FIG. 3A, FIG. 3B, FIG. 3C, FIG. 3D, FIG. 3E and FIG. 3F are cross-sectional views of a semiconductor package device 30 at various stages of fabrication, in accordance with some embodiments of a method of manufacturing a semiconductor package device of the present disclosure. Various figures have been simplified to more clearly present aspects of the present disclosure. In some embodiments, the semiconductor package device 30 has the same or similar properties as those of the semiconductor package device 10 in FIG. 1B. The method illustrated with FIGS. 3A to 3F may have similar operations as the method illustrated with FIGS. 2A to 2I. Some of the differences are described below.

Figure 3A:
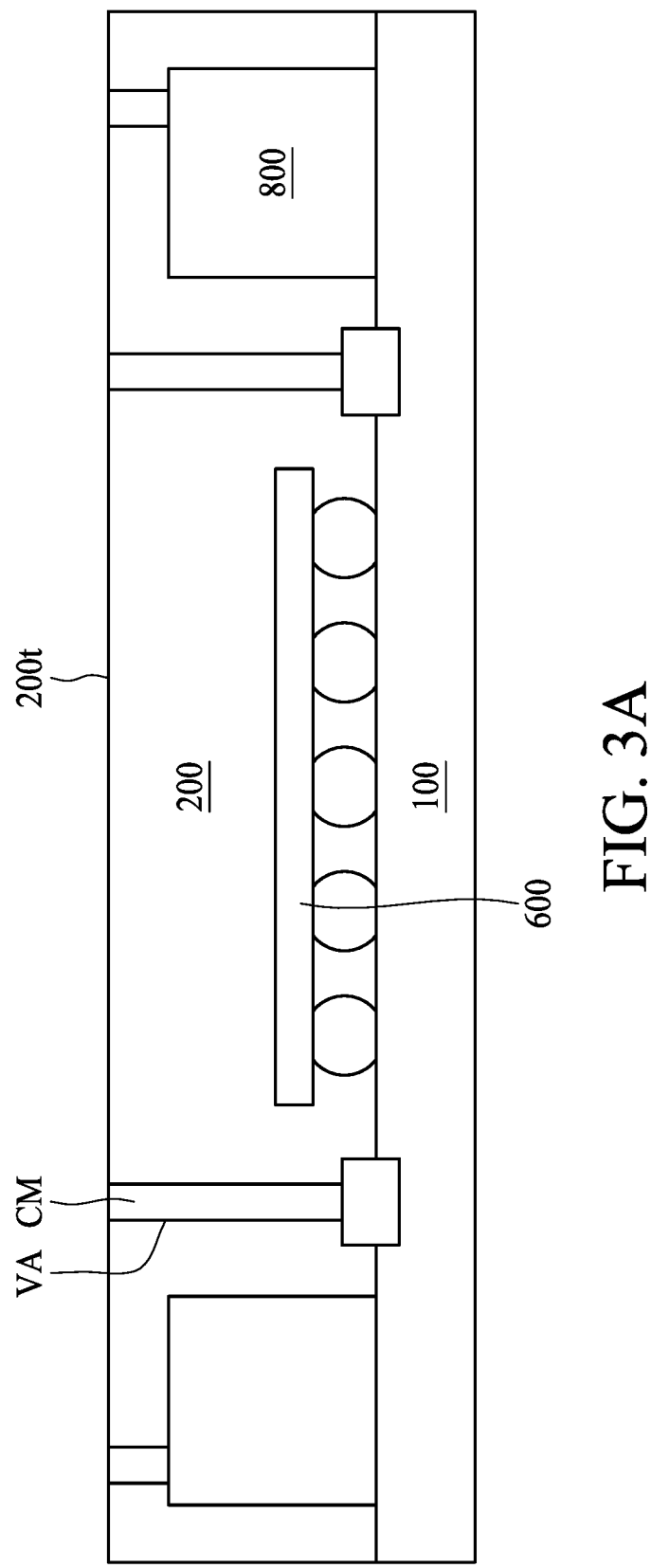
FIG. 3A, FIG. 3B, FIG. 3C, FIG. 3D, FIG. 3E and FIG. 3F illustrate a method of manufacturing a semiconductor package device in accordance with some embodiments of the present disclosure.

Referring to FIG. 3A, after the molding compound 200 is formed on the substrate 100, the electronic component 600 and the electronic component 800, some vias VA are formed through the molding compound 200. The vias VA may be formed by a drilling or etching process. The conductive material CM is then filled into the vias VA.

Figure 3B:
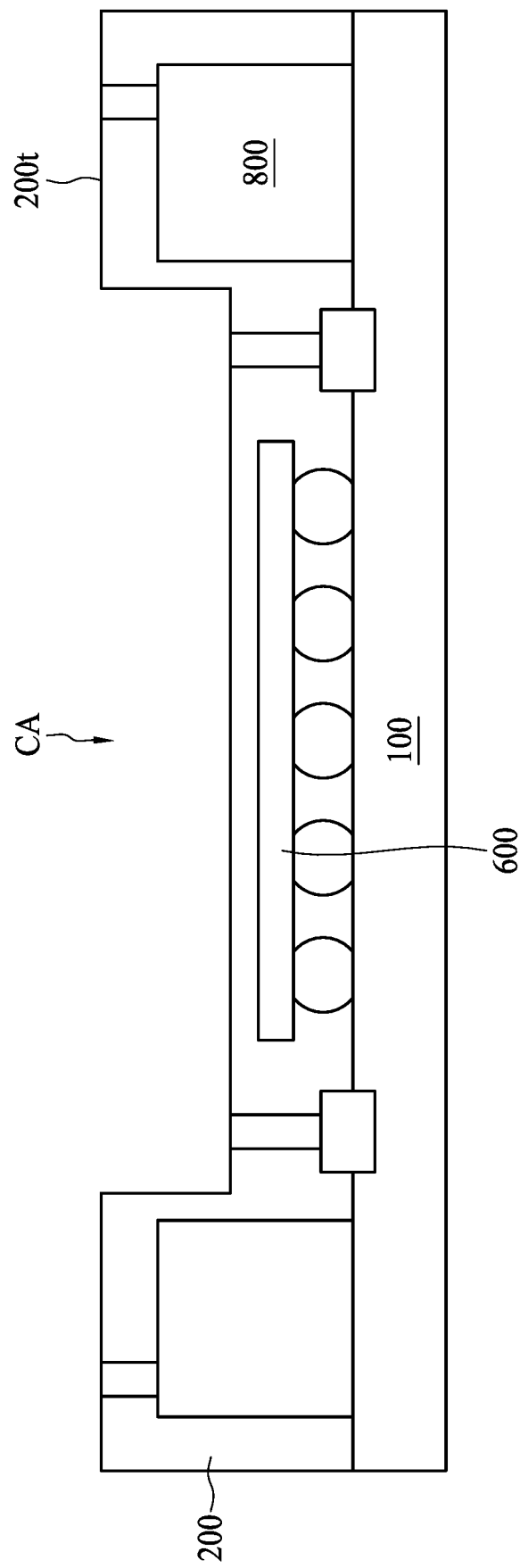
Figure 3C:
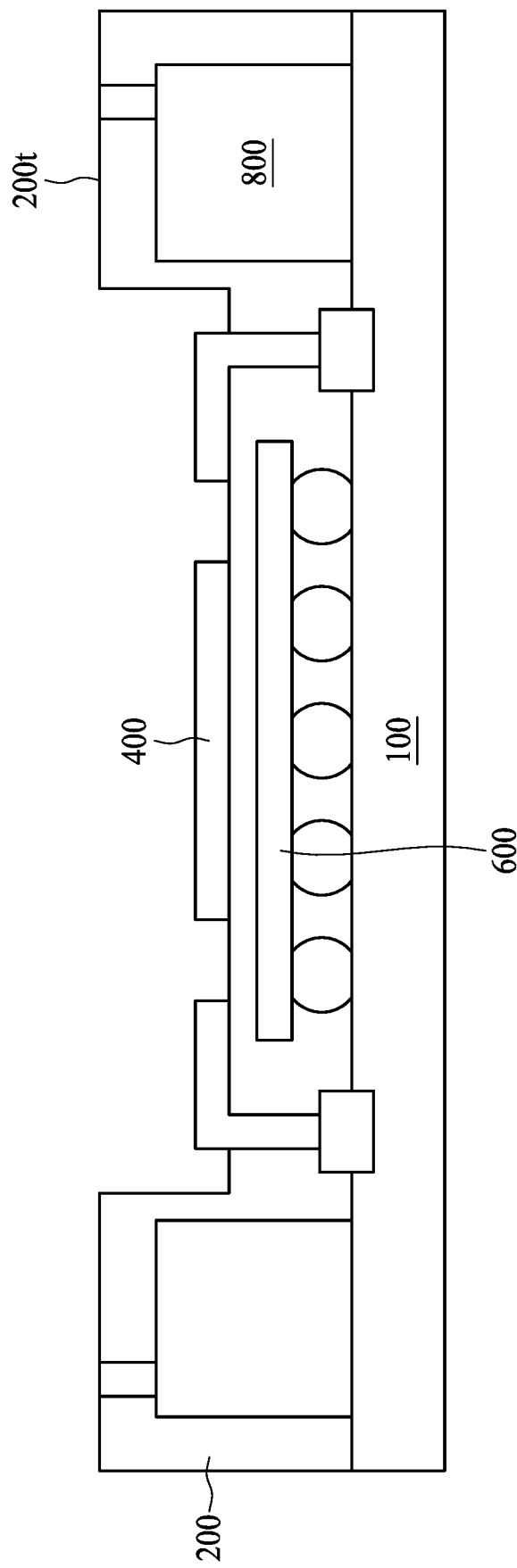

Referring to FIG. 3B, a portion of the molding compound 200 and a portion of the conductive material CM are removed (for example, by a drilling process) to form a cavity CA on a surface 200t of the molding compound 200. Referring to FIG. 3C, a conductive trace 400 is formed on a bottom surface of the cavity CA to be electrically connected to the remaining portion of the conductive material CM. The conductive trace 400 may be formed by a dispensing process.

Figure 3D:
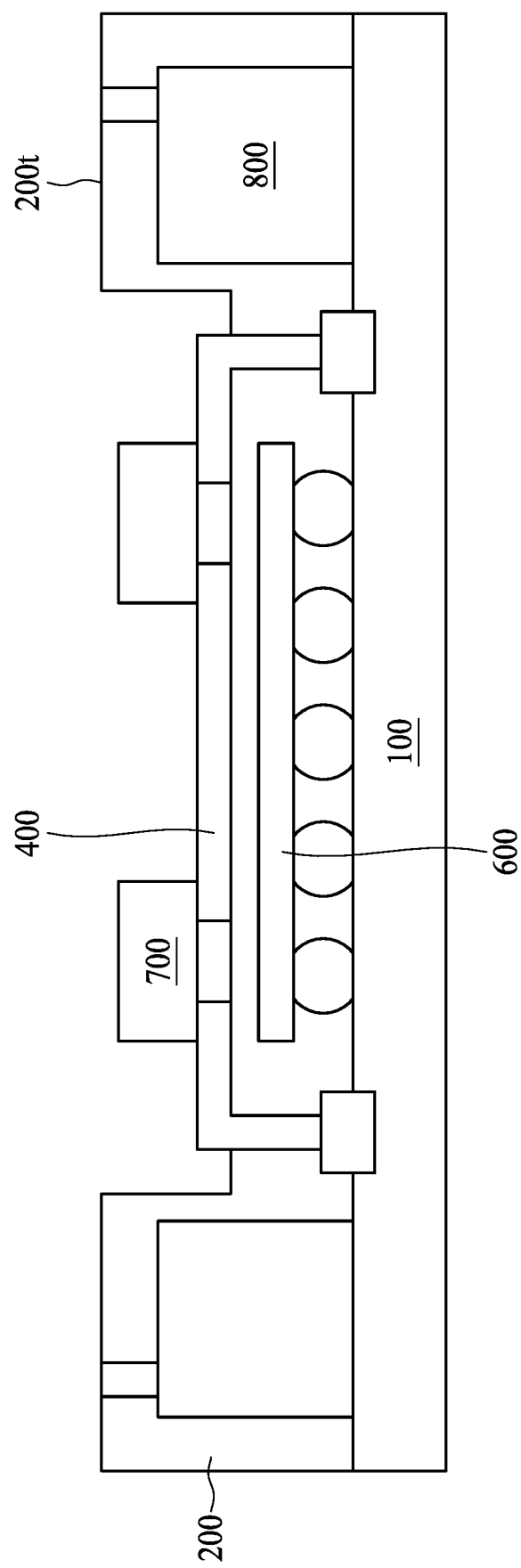
Figure 3E:
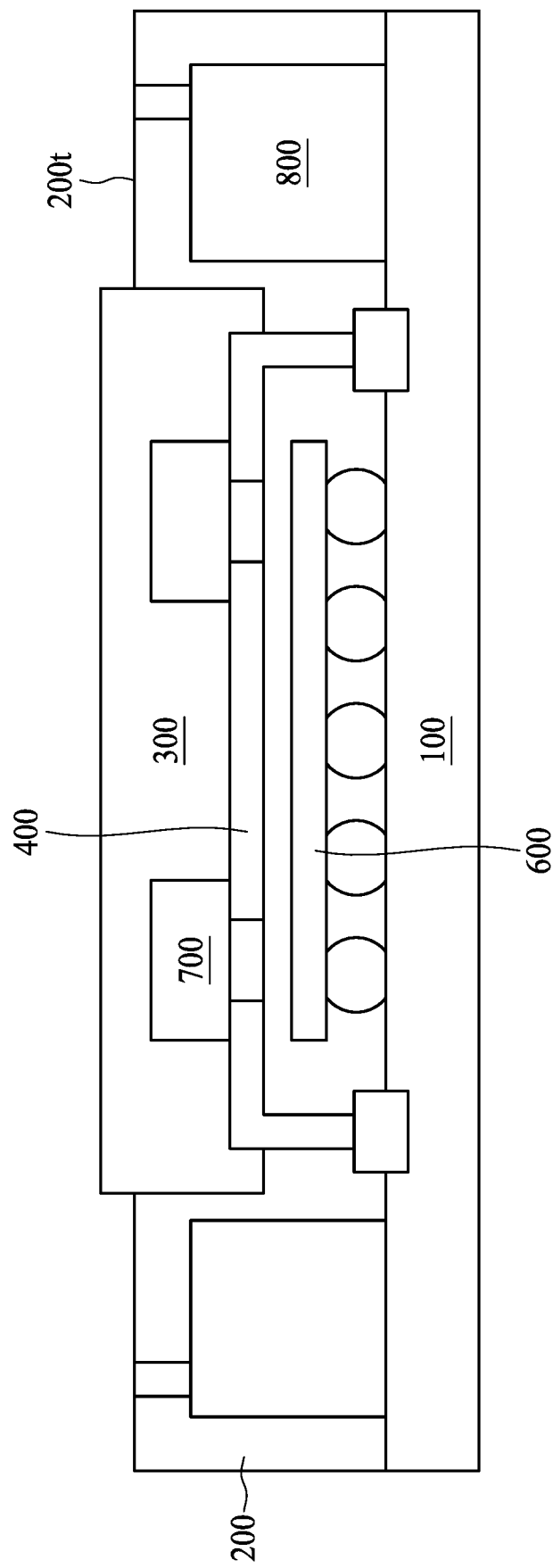
Figure 3F:
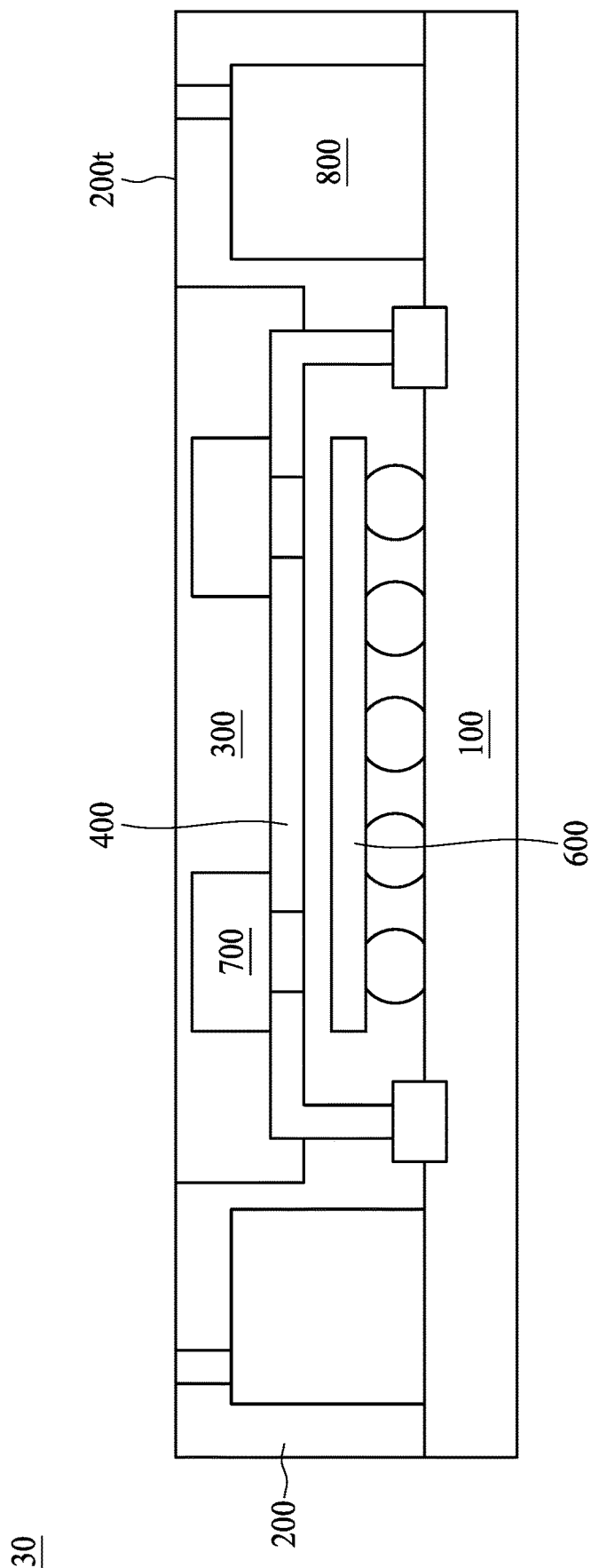

Referring to FIG. 3D, another electronic component 700 is disposed within the cavity CA and on the conductive trace 400. The electronic component 700 may be disposed on the conductive trace 400 and spaced apart from the molding compound 200. For example, the electronic component 700 and the molding compound 200 may define a space or a gap therebetween. Referring to FIGS. 3E and 3F, the operations of forming another molding compound 300 and grinding from a top surface may be similar to those described in FIGS. 2H and 2I.

FIG. 4A, FIG. 4B, FIG. 4C and FIG. 4D illustrate a method of forming a conductive trace 400 in accordance with some embodiments of the present disclosure.

Figure 4A:
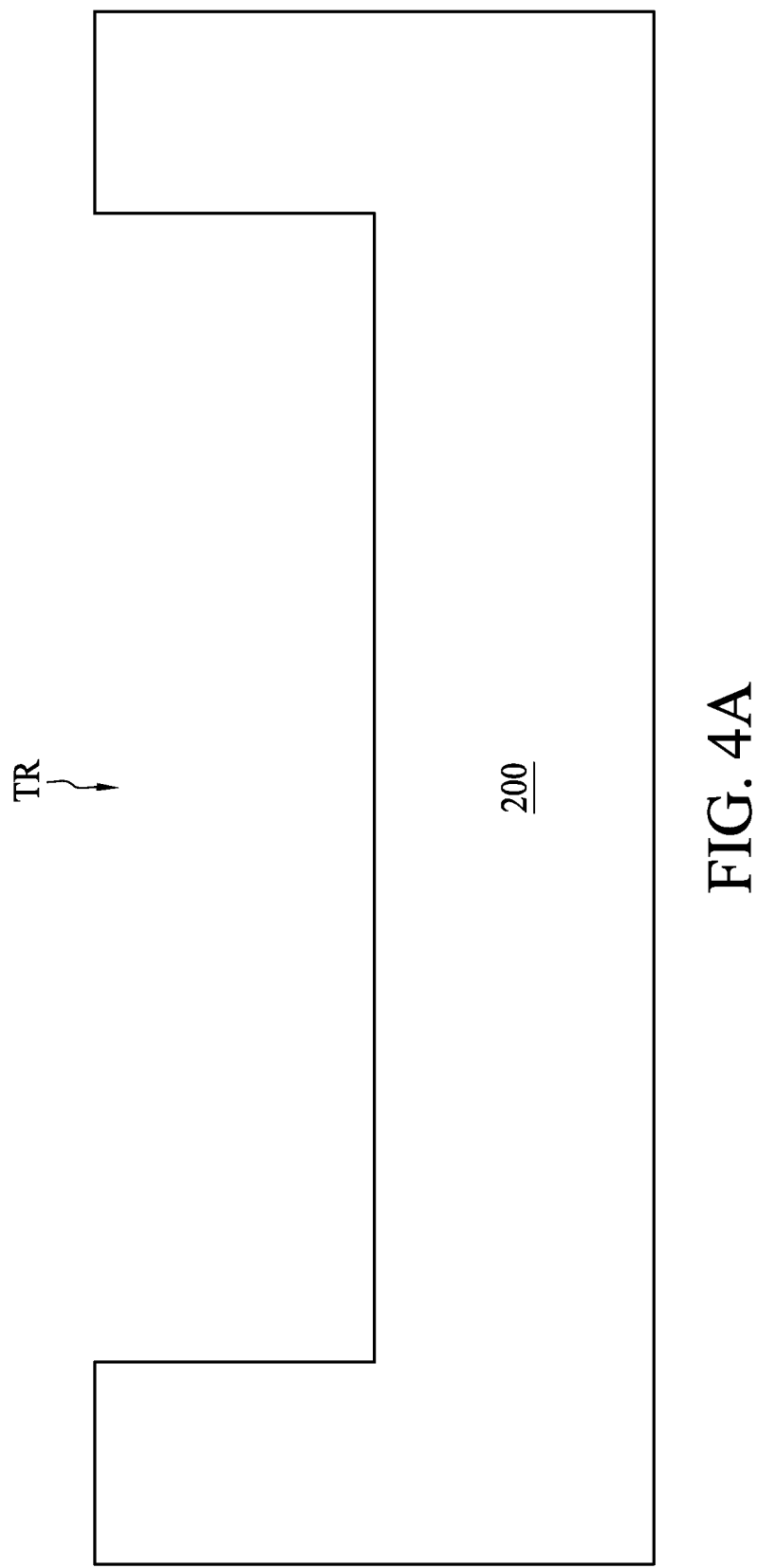
Figure 4B:
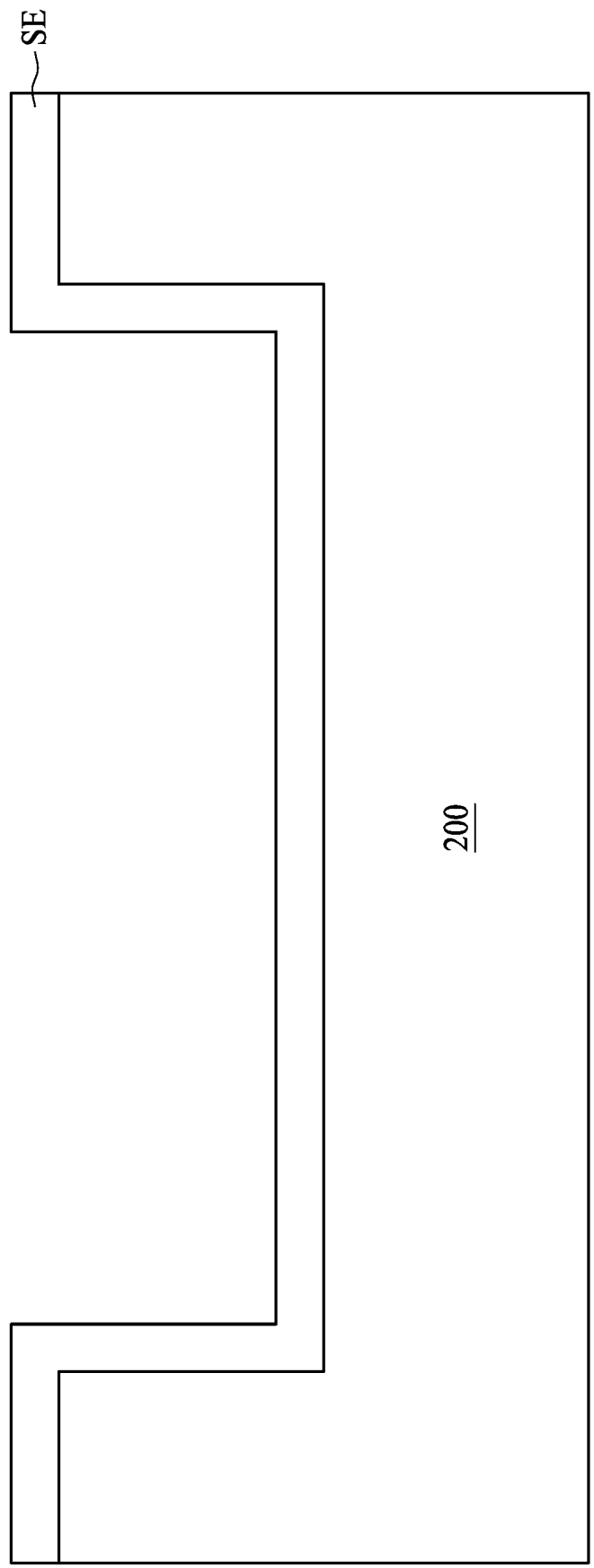

In FIG. 4A, a trench (or a trench pattern) TR is formed on a top surface of the molding compound 200 by, for example, a laser or an etching process. In FIG. 4B, a seed layer or a buffer layer SE is disposed on the top surface of the molding compound 200, and on a bottom surface and sidewalls of the trench TR. The seed layer may include conductive material and may be formed by a sputter or plating process.

Figure 4D:
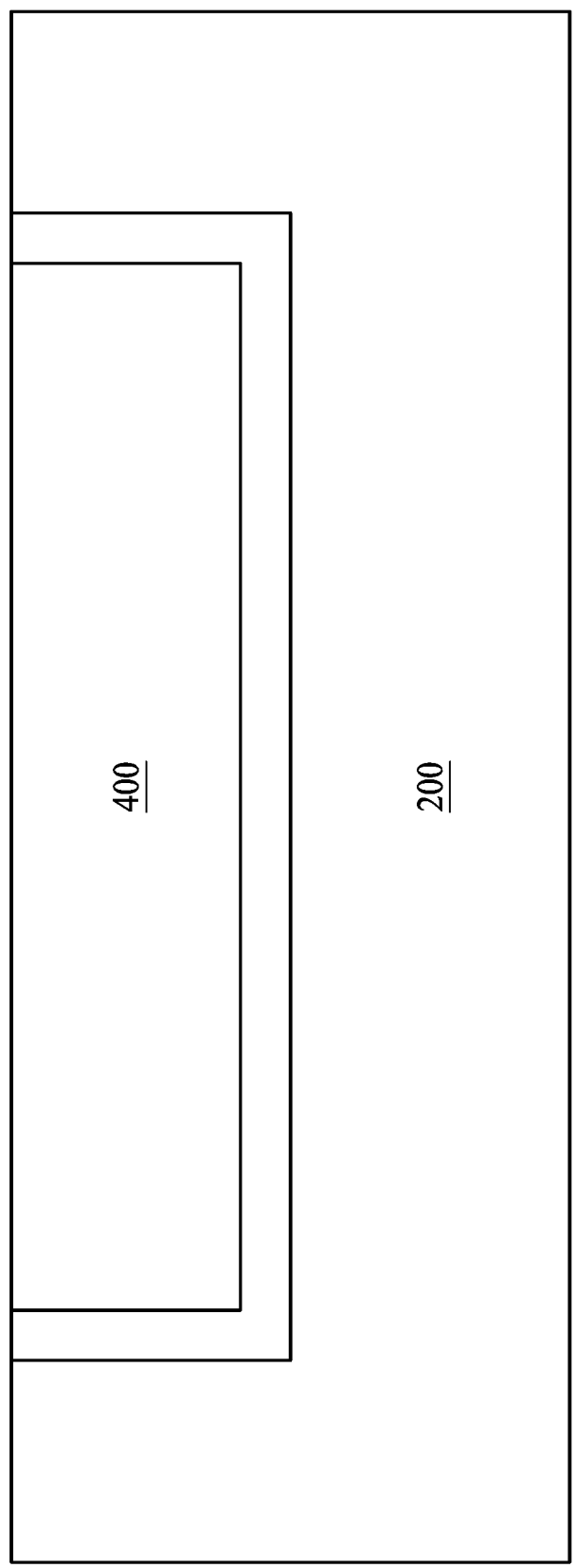

In FIG. 4C, a conductive material CM is disposed within the trench TR and on the seed layer SE. The conductive material CM may be formed by a screen printing, a vacuum printing, or a dispensing process. In FIG. 4D, a flatness treatment such as a grinding process is performed to remove a portion of the conductive material CM or a portion of the seed layer, such that the conductive trace 400 is formed. With the flatness treatment, a surface of the conductive trace 400, a surface of the seed layer SE or a surface of the molding compound 200 may be coplanar with each other. In some embodiments, a void may be formed within the conductive trace 400 (or the conductive material CM) during a dispensing process, and the seed layer SE functions to secure or improve the conductivity of the conductive trace 400.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be planar or substantially planar if a difference between a highest point and a lowest point of the surface is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and that equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus due to variables in the manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
a substrate having a first surface;
a first electronic component on the first surface of the substrate and electrically connected to the substrate;
a first encapsulant on the first surface of the substrate and covering at least a side of the first electronic component opposite to the substrate;
a second electronic component on the first encapsulant;
a first conductive trace within the first encapsulant, wherein a projection area of the first conductive trace on the substrate is overlapped with a projection area of the second electronic component on the substrate;
a second encapsulant embedded within the first encapsulant and encapsulating the second electronic component;
a top surface of the first conductive trace contacting the second encapsulant, a bottom surface of the first conductive trace contacting the first encapsulant;
and wherein an uppermost surface of the first encapsulant is substantially coplanar with an uppermost surface the second encapsulant.

2. The semiconductor package device of claim 1, wherein the first encapsulant has a recess in which the second electronic component is disposed.

3. The semiconductor package device of claim 1, wherein the first encapsulant has a first surface in contact with the bottom surface of the first conductive trace and a second surface coplanar with the top surface of the first conductive trace, and a roughness of the first surface of the first encapsulant is greater than a roughness of the second surface of the first encapsulant.

4. The semiconductor package device of claim 1, further comprising a second conductive trace within the first encapsulant and electrically connected to the first conductive trace, wherein the first conductive trace is substantially parallel to the first surface of the substrate and the second conductive trace is substantially perpendicular to the first surface of the substrate.

5. The semiconductor package device of claim 4, further comprising a stop layer on the first surface of the substrate and in contact with the second conductive trace.

6. The semiconductor package device of claim 1, further comprising a shielding layer covering the first encapsulant and the second encapsulant.

7. The semiconductor package device of claim 1, further comprising a third electronic component on the first surface of the substrate and covered by the first encapsulant, wherein a thickness of the third electronic component is greater than a thickness of the first electronic component or a sum of the thickness of the first electronic component and a thickness of the second electronic component.

8. The semiconductor package device of claim 7, further comprising a second conductive trace penetrating the first encapsulant and electrically connected to the third electronic component.

9. A semiconductor package device, comprising:
a substrate;
a first electronic component disposed on the substrate and electrically connected to the substrate;
a first encapsulant disposed on the substrate and covering the first electronic component, the first encapsulant having a first top surface and a second top surface recessed from the first top surface;
a second electronic component disposed on the second top surface of the first encapsulant; and
a conductive trace disposed within the first encapsulant and in contact with the second electronic component and the substrate, wherein the conductive trace comprises:
a first portion substantially perpendicular to a surface of the substrate on which the first electronic component is disposed; and
a second portion substantially perpendicular to the first portion and electrically connected to the first portion, and wherein the second portion of the conductive trace has a top surface and a bottom surface opposite to the top surface of the second portion of the conductive trace, and the bottom surface of the second portion of the conductive trace is covered by the first encapsulant and defines an interface with the first encapsulant; and a roughness of the interface between the bottom surface of the second portion of the conductive trace and the first encapsulant is greater than a roughness of the second top surface of the first encapsulant.

10. The semiconductor package device of claim 9, further comprising a second encapsulant disposed on the second top surface of the first encapsulant and covering the second electronic component.

11. The semiconductor package device of claim 1, wherein the first encapsulant comprises at least one of the following: an epoxy resin having fillers, a molding compound, a polyimide, a phenolic compound, and a material with a silicone dispersed therein.

12. The semiconductor package device of claim 1, wherein the first encapsulant comprises a monolithic structure, and the first encapsulant is disposed between the first electronic component and the second electronic component.

13. The semiconductor package device of claim 1, further comprising:
a third electronic component on the first encapsulant, wherein the second electronic component and the third electronic component are at a same elevation.

14. The semiconductor package device of claim 1, wherein the first conductive trace is fan-in with respect to the second electronic component.

15. The semiconductor package device of claim 1, further comprising:
ah third electronic component on a periphery of the first surface of the substrate.

16. The semiconductor package device of claim 15, wherein the third electronic component and the first electronic component are at a same elevation.

* * * * *